(12) United States Patent
Wu et al.

(10) Patent No.: US 6,312,983 B1
(45) Date of Patent: Nov. 6, 2001

(54) ETCHING METHOD FOR REDUCING BIT LINE COUPLING IN A DRAM

(75) Inventors: Joseph Wu; Chen-Wei Chen, both of Hsinchu; Nien-yu Tsai, Taipei; J. S. Shiao, Hsinchu, all of (TW)

(73) Assignee: ProMOS Technologies, Inc., Hsinchu (TW)

( * ) Notice: Subject to any disclaimer, the term of this patent is extended or adjusted under 35 U.S.C. 154(b) by 0 days.

(21) Appl. No.: 09/426,071

(22) Filed: Oct. 21, 1999

(51) Int. Cl.[7] .................................................. H01L 21/8242

(52) U.S. Cl. ........................... 438/238; 438/253; 438/743

(58) Field of Search ..................................... 438/238–240, 438/253–256, 396–399, 743–744

(56) References Cited

U.S. PATENT DOCUMENTS

| 5,294,561 | * | 3/1994 | Tanigawa et al. . | |
|---|---|---|---|---|
| 5,422,295 | * | 6/1995 | Choi et al. . | |
| 5,746,884 | * | 5/1998 | Gupta et al. . | |
| 5,998,251 | * | 12/1999 | Wu et al. | 438/241 |
| 6,040,247 | * | 3/2000 | Chung | 438/713 |

* cited by examiner

Primary Examiner—Jey Tsai
(74) Attorney, Agent, or Firm—Blakely Sokoloff Taylor & Zafman, LLP

(57) ABSTRACT

A method for forming a bit line of a DRAM memory array is disclosed. The method comprises the steps of: forming an interlayer dielectric over the DRAM memory array; etching the interlayer dielectric to form trenches in the interlayer dielectric, the trenches collectively forming a bit line pattern and having tapered side walls; and depositing a conductive material into the trenches to form the bit line.

1 Claim, 1 Drawing Sheet

ETCHING METHOD FOR REDUCING BIT LINE COUPLING IN A DRAM

BACKGROUND OF THE INVENTION

1. Field of the Invention

The present invention relates to DRAM bit lines, and more particularly, to a method of etching an interlayer dielectric (ILD) that will reduce coupling between adjacent bit lines.

2. Background Information

As DRAMs become more highly integrated, the spacing between individual memory cells decreases. This causes many design and engineering challenges. One of the necessary steps in manufacturing a DRAM is the masking and etching of repetitively patterned interconnects, such as the bit line. The bit line, along with a word line, are the two primary control lines used to read and write to a DRAM memory cell. As the spacing between the typically parallel bit lines decreases, one effect is capacitive coupling between bit lines. One factor that has a large effect on the amount of capacitive coupling is the cross-sectional area of the bit line. For a dual damascene process, the width of the bit line is limited to the critical dimension of the photolithography process. Thus, at the photolithography limit, the cross-section of the bit line cannot be reduced further.

Therefore, what is needed is a method to manufacture bit lines having a reduced cross-section while using photolithography techniques that are currently in use today.

SUMMARY OF THE INVENTION

A method for forming a bit line of a DRAM memory array is disclosed. The method comprises the steps of: forming an interlayer dielectric over the DRAM memory array; etching said interlayer dielectric to form trenches in said interlayer dielectric, said trenches collectively forming a bit line pattern, said trenches having tapered side walls; and depositing a conductive material into said trenches to form said bit line.

BRIEF DESCRIPTION OF DRAWINGS

The present invention will be described in conjunction with the following drawings, wherein.

DETAILED DESCRIPTION OF THE INVENTION

Figure 1:
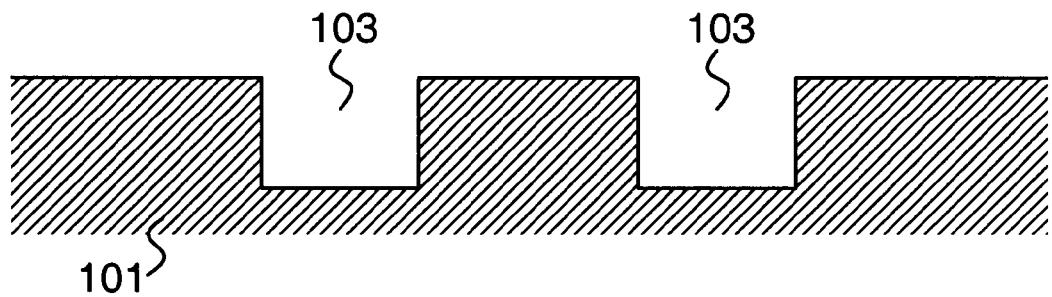
FIG. 1 is a cross-sectional view of a trench for containing a bit line formed in an oxide, the trench having a shape in accordance with the prior art.

Turning to FIG. 1, a typical dual-damascene process involves the etching of trenches 103 in an oxide 101. The oxide 101 is typically some type of chemical vapor deposition (CVD) oxide, or can be any one of the oxides used to form interlayer dielectrics (ILD). For example, the oxide may be a high density plasma CVD oxide, a BPSG oxide, a TEOS oxide, a spin-on-glass oxide, or even a thermal oxide.

The trenches 103 formed in the oxide 101 are later filled by a conductive material, such as aluminum or tungsten. The pattern of the trenches 103 is dictated by the pattern required by the bit line interconnections. Although not shown in FIG. 1, contact vias are often etched into the oxide 101 at the same time the trenches 103 are etched. The contact vias extend from the bottom of a trench 103 down to the underlying electrically conductive layer. The process of etching the contact vias and the trenches 103 in an oxide and refilling these trenches and contact vias with a conductive material is known in the art as a dual damascene process.

Note that in FIG. 1, the trenches 103 are preferably formed having vertical side walls. For example, in one prior art etching recipe that is performed on the Model MxP+ machine manufactured by Applied Materials, the following etching recipe is used to generate the vertical side walls. The pressure is set at 130 millitorr, the power setting is 1000 watts, the flow rate of $CHF_3$ gas is 35 sccm, the flow rate of $CF_4$ is 25 sccm, and the flow rate of Ar is 150 sccm. The etching recipe described above generates substantially vertical side walls for the trenches 103.

After the trenches 103 are formed, a conductive material is deposited into the trenches 103. The conductive material will have a cross-sectional shape that conforms to the shape of the trench 103. As noted above, the cross-section of the bit line directly effects the amount of bit line capacitance. While it would be preferable to minimize the cross-section of the bit line (i.e. the trenches 103) directly, limits in current photolithography technology preclude this solution.

In accordance with the present invention, the bit line trenches in the dual-damascene process are formed to have a tapered cross-section. By using conventional photolithography techniques, and by tapering the side walls of the trenches, a lower cross-section area for the bit line may be achieved.

Figure 2:
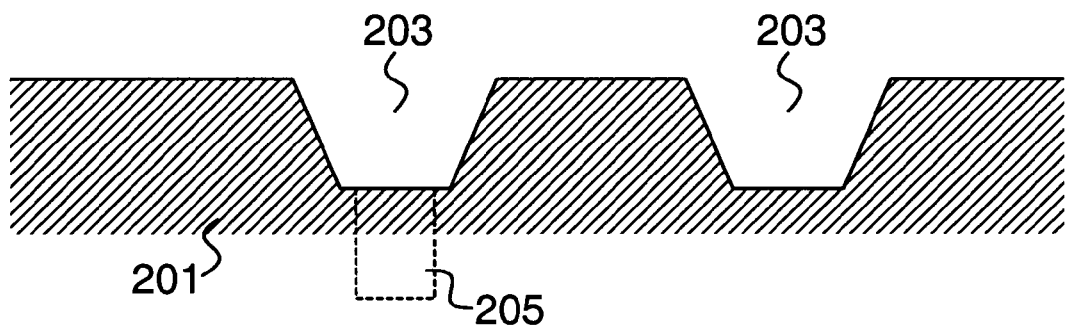
FIG. 2 is a trench formed in an oxide for containing a bit line, the trench,formed in accordance with the present invention.

Thus, turning to FIG. 2, an oxide layer 201 has formed therein trenches 203. For completeness, a contact via 205 is shown extending downwardly from the bottom of one of the trenches 203 and connecting to an underlying conductive structure in the DRAM memory array. The conductive structure may be, for example, a source, a drain, a gate, or a capacitor plate of a DRAM cell. The oxide layer 201 is the same oxide that is used in the prior art. However, the trenches 203 that are formed in the oxide 201 are formed using an etching recipe that will provide for tapered side walls.

The etching recipe is as follows for the Model MxP+ machine manufactured by Applied Materials. A pressure of 130 millitorr, a power of 1000 watts, a flow rate of $CHF_3$ of 50 sccm, a flow rate of $CF_4$ of 10 sccm, and a flow rate of Ar of 150 sccm. It has been found that this recipe when performed on the etching apparatus will provide the tapered side walls of the trenches 203 as shown in FIG. 2. In fact, the taper angle can be adjusted by recipe tuning.

It can be appreciated that varying etching recipes may be used to form the tapered side walls, particularly on different types of semiconductor etching apparatus. The primary consideration is that by having the side walls of the trenches 203 be tapered, the resultant cross-section of the bit line formed in the trenches 203 will be smaller than that of the prior art. This will reduce the capacitive coupling between bit lines.

While the preferred embodiment of the invention has been illustrated and described, it will be appreciated that various changes can be made therein without departing from the spirit and scope of the invention.

What is claimed is:

1. A method for forming a bit line of a DRAM memory array, the method comprising the steps of:

forming an interlayer dielectric over the DRAM memory array;

etching said interlayer dielectric to form trenches in said interlayer dielectric, said trenches collectively forming a bit line pattern, said trenches having tapered side walls; and depositing a conductive material into said trenches to form said bit line; wherein said etching step to form said trenches is performed at substantially the following process parameters:

a pressure of 130 millitorr;

a power of 1000 watts;

a flow rate of $CHF_3$ of 50 sccm;

a flow rate of $CF_4$ of 10 sccm; and a flow rate of Ar of 150 sccm.

\* \* \* \* \*